US012712474B2

(12) United States Patent
Yazdani et al.

(10) Patent No.: US 12,712,474 B2
(45) Date of Patent: Aug. 18, 2026

(54) ELECTROSTATIC CHUCK HAVING MULTI ZONE GAS COOLING

(71) Applicant: Applied Materials, Inc., Santa Clara, CA (US)

(72) Inventors: Sajad Yazdani, Fremont, CA (US); Jaeyong Cho, San Jose, CA (US); Alexander Sulyman, San Francisco, CA (US); Tomoaki Kohzu, Cupertino, CA (US); Kyounghwan Na, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 92 days.

(21) Appl. No.: 18/789,634

(22) Filed: Jul. 30, 2024

(65) Prior Publication Data

US 2025/0096703 A1 Mar. 20, 2025

Related U.S. Application Data

(60) Provisional application No. 63/539,310, filed on Sep. 19, 2023.

(51) Int. Cl.
*C23C 16/458* (2006.01)
*H02N 13/00* (2006.01)

(52) U.S. Cl.
CPC ......... *H02N 13/00* (2013.01); *C23C 16/4586* (2013.01)

(58) Field of Classification Search
CPC . H02N 13/00; C23C 16/4586; H10P 72/0434; H10P 72/72
USPC ......... 361/234, 233, 230; 279/128; 438/706, 438/707, 710, 714, 715, 782
See application file for complete search history.

(56) References Cited

U.S. PATENT DOCUMENTS 11,764,041 B2 * 9/2023 Garcia De Gorordo .................... H01J 37/32724 361/234
2015/0332942 A1 * 11/2015 Peh ..................... H10P 72/0434 165/61
2015/0348813 A1 * 12/2015 Mangalore ............ H10P 72/722 219/634
2015/0380220 A1 * 12/2015 Tan ................... H01J 37/32724 219/443.1
2018/0148835 A1 * 5/2018 Erickson ............. C23C 16/4411
2018/0166311 A1 * 6/2018 Boyd, Jr. ............ H10P 72/7616
2018/0174880 A1 * 6/2018 Swaminathan ..... H10P 72/0434
2019/0371577 A1 * 12/2019 Benjaminson .... H01J 37/32724
(Continued)

*Primary Examiner* — Elim Ortiz
(74) *Attorney, Agent, or Firm* — Moser Taboada

(57) ABSTRACT

Embodiments of electrostatic chucks (ESCs) are provided herein. In some embodiments, an electrostatic chuck includes: a dielectric plate having an upper surface and a plurality of mesas extending from the upper surface to a first height to at least partially define a support surface for the substrate; four backside gas cooling zones disposed in the dielectric plate; four gas channels disposed in the dielectric plate and corresponding to the four backside gas cooling zones, wherein the four gas channels are fluidly independent within the dielectric plate and extend from a lower surface of the dielectric plate to a plurality of cooling gas outlets extending to the upper surface within each corresponding cooling zone; a plurality of seal rings extending from the upper surface of the dielectric plate to the first height and defining the four backside gas cooling zones; and one or more electrodes disposed in the dielectric plate.

16 Claims, 4 Drawing Sheets

(56) References Cited

U.S. PATENT DOCUMENTS

2020/0395197 A1* 12/2020 Garcia De Gorordo .................... H01J 37/32724
2021/0296098 A1* 9/2021 Cho .................. H01J 37/32724
2022/0308462 A1* 9/2022 Berney ..................... G03F 7/16

* cited by examiner

ELECTROSTATIC CHUCK HAVING MULTI ZONE GAS COOLING

CROSS-REFERENCE TO RELATED APPLICATIONS

This application claims benefit of U.S. provisional patent application Ser. No. 63/539,310, filed Sep. 19, 2023, which is herein incorporated by reference in its entirety.

FIELD

Embodiments of the present disclosure generally relate to a substrate processing equipment, and more specifically, to electrostatic chucks for use in substrate processing equipment.

BACKGROUND

In the manufacture of integrated circuits, precise control of various process parameters achieves consistent process results on an individual substrate, as well as process results that are reproducible from substrate to substrate. As the geometry limits of the structures for forming semiconductor devices are pushed against technology limits, tighter tolerances and precise process control improve fabrication success. For example, during processes such as plasma etch or deposition processes, changes in the temperature and/or temperature gradients across the substrate negatively impact etch or deposition uniformity. Etch throughput or deposition throughput depends on temperature uniformity.

A substrate support is typically utilized to hold a substrate during processing and control the temperature of a substrate during processing, often through control of backside gas distribution. However, current backside gas distribution schemes are inadequate at reducing temperature non-uniformity across the substrate.

Accordingly, the inventors have provided herein embodiments of substrate supports for improved backside gas distribution to increase temperature control and enhance processing throughput.

SUMMARY

Embodiments of electrostatic chucks for holding a substrate are provided herein. In some embodiments, an electrostatic chuck includes: a dielectric plate having an upper surface and a plurality of mesas extending from the upper surface to a first height to at least partially define a support surface for the substrate; four backside gas cooling zones disposed in the dielectric plate; four gas channels disposed in the dielectric plate and corresponding to the four backside gas cooling zones, wherein the four gas channels are fluidly independent within the dielectric plate and extend from a lower surface of the dielectric plate to a plurality of cooling gas outlets extending to the upper surface within each corresponding cooling zone; a plurality of seal rings extending from the upper surface of the dielectric plate to the first height and defining the four backside gas cooling zones; and one or more electrodes disposed in the dielectric plate and configured to chuck the substrate when disposed on the support surface.

In some embodiments, an electrostatic chuck for holding a substrate, includes: a dielectric plate having an upper surface and a plurality of mesas extending from the upper surface to a first height to at least partially define a support surface for the substrate; four backside gas cooling zones disposed in the dielectric plate; four gas channels disposed in the dielectric plate and corresponding to the four backside gas cooling zones, wherein the four gas channels are fluidly independent within the dielectric plate and extend from a lower surface of the dielectric plate to a plurality of cooling gas outlets extending to the upper surface within each corresponding cooling zone; a plurality of seal rings extending from the upper surface of the dielectric plate to the first height and defining the four backside gas cooling zones, wherein a first of the seal rings is disposed about 15 to 25 mm from a center of the dielectric plate, a second of the seal rings is disposed about 100 to about 130 mm from the center, a third of the seal rings is disposed about 135 to about 142 mm from the center, and a fourth of the seal rings is disposed about 142 to about 148 mm from the center; and one or more electrodes disposed in the dielectric plate and configured to chuck the substrate when disposed on the support surface.

In some embodiments, a process chamber for processing a substrate, includes: a chamber body defining an interior volume therein; an electrostatic chuck disposed in the interior volume, the electrostatic chuck comprising: a dielectric plate having an upper surface and a plurality of mesas extending from the upper surface to a first height to at least partially define a support surface for the substrate; four backside gas cooling zones disposed in the dielectric plate; four gas channels disposed in the dielectric plate and corresponding to the four backside gas cooling zones, wherein the four gas channels are fluidly independent within the dielectric plate and extend from a lower surface of the dielectric plate to a plurality of cooling gas outlets extending to the upper surface within each corresponding cooling zone; a plurality of seal rings extending from the upper surface of the dielectric plate to the first height and defining the four backside gas cooling zones; and one or more electrodes disposed in the dielectric plate and configured to chuck the substrate when disposed on the support surface; and a backside gas source for supplying a cooling gas to each of the four backside gas cooling zones via supply lines that extend to corresponding ones of the gas channels.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
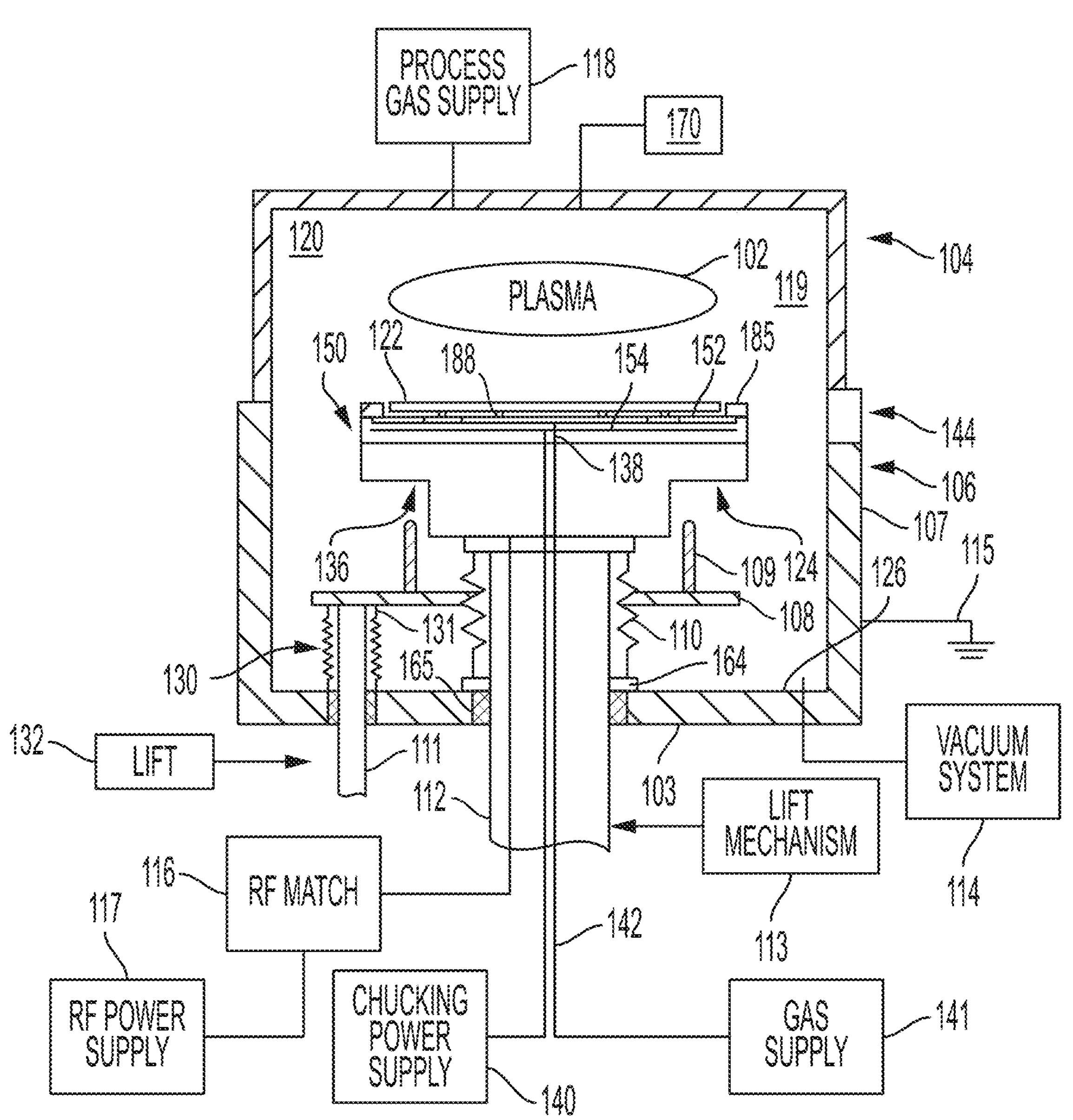
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports having electrostatic chucks (ESCs) with a plurality of gas cooling zones are provided herein. During processing, the inventors have observed that temperatures across a substrate are typically elevated near a center region of the substrate and edge regions of the substrate. However, conventional cooling of the substrate with backside gas provided via one or two cooling zones causes a global cooling effect on the substrate that further increases temperature non-uniformity across the substrate. As such, the inventors have provided improved ESCs advantageously having four independently controlled cooling zones.

An innermost one of the four cooling zones acts as a primary, or master center cooling zone. A second innermost one of the four cooling zones acts as a secondary center cooling zone. An outermost one of the four cooling zones acts as a primary, or master edge cooling zone. A second outermost one of the four cooling zones acts as a secondary edge cooling zone. The master center cooling zone and the master edge cooling zone are advantageously smaller in width or area than the secondary center cooling zone and secondary edge cooling zone, respectively, for reduced global cooling effects from the master center cooling zone and the master edge cooling zone.

FIG. 1 depicts a schematic side view of a process chamber in accordance with at least some embodiments of the present disclosure. In some embodiments, the process chamber 100 is an etch chamber configured for performing an etch process on a substrate 122. In other embodiments, the process chamber 100 may be a deposition chamber, or any other suitable chamber for substrate processing that includes backside gas flow. The process chamber 100 may generally be a vacuum chamber that is suitably adapted to maintain sub-atmospheric pressures within an interior volume 120 during substrate processing. The process chamber 100 includes a chamber body 106 having a bottom plate 103, a lid 104, and sidewalls 107 extending from the bottom plate 103 to the lid 104. The chamber body 106 is made of a suitable material, for example, aluminum.

A substrate support 124 is disposed within the interior volume 120 to support and retain a substrate 122, such as a glass substrate, a semiconductor wafer, or other such substrate as may be retained. The substrate support 124 may generally comprise a pedestal 150 coupled to a hollow shaft 112. The pedestal 150 comprises an electrostatic chuck (ESC) 152. In some embodiments, the substrate support 124 includes a base assembly 136 having a cooling plate 264 (see FIG. 2) disposed below the ESC 152. In some embodiments, the substrate support 124 may include an edge ring 185 disposed on the ESC 152. The ESC 152 generally includes one or more chucking electrodes 154 configured to electrostatically chuck the substrate 122 to the ESC 152. The one or more chucking electrodes 154 may also electrostatically chuck the edge ring 185 to the ESC 152. In some embodiments, the ESC 152 is made of a ceramic material, for example aluminum oxide ($Al_2O_3$).

The hollow shaft 112 provides a conduit to provide, for example, backside gases, process gases, fluids, coolants, power, or the like, to the pedestal 150. In some embodiments, the hollow shaft 112 is coupled to a lift mechanism 113, such as an actuator or motor, which provides vertical movement of the pedestal 150 between an upper, processing position and a lower, transfer position. A bellows assembly 110 is disposed about the hollow shaft 112 and is coupled between the pedestal 150 and a bottom surface 126 of the process chamber 100 to provide a flexible seal that allows vertical motion of the pedestal 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

The process chamber 100 is coupled to and in fluid communication with a process gas supply 118 which may supply one or more process gases to the process chamber 100 for processing the substrate 122. The interior volume 120 may include a processing volume 119 located in the upper half of the interior volume 120 and generally between the substrate support 124 and the lid 104. The process chamber 100 may also include one or more shields (not shown) circumscribing various chamber components to prevent unwanted reaction between such components and ionized process material. The chamber body 106 may be made of metal, such as aluminum. The chamber body 106 may be grounded via a coupling to ground 115.

In some embodiments, the hollow shaft 112 facilitates coupling a backside gas source 141, a chucking power supply 140, and RF power sources (e.g., a bias power supply 117) to the pedestal 150. In some embodiments, the bias power supply 117 includes one or more RF bias power sources. In some embodiments, an RF plasma power supply 170 is coupled to the lid 104. In some embodiments, RF energy supplied by the RF plasma power supply 170 may have a frequency of about 400 KHz to over 40 MHz. A plasma 102 may be formed in the interior volume. For example, in some embodiments, the RF plasma power supply 170 is coupled to an antenna assembly or electrode to couple RF energy to a plasma 102 in the interior volume 120. The backside gas source 141 is disposed outside of the chamber body 106 and supplies heat transfer gas to the pedestal 150. In some embodiments, a bias power supply 117 and the RF plasma power supply 170 are coupled to the pedestal 150 via respective RF match networks (only RF match network 116 shown). In some embodiments, the substrate support 124 may alternatively include AC, DC, or RF bias power. In some embodiments, the AC, DC, or RF bias power may be pulsed.

The process chamber 100 may include a second lift 130. The second lift 130 can include a plurality of lift pins 109 mounted on a platform 108 connected to a shaft 111 which is coupled to a second lift mechanism 132 for raising and lowering the second lift 130. The plurality of lift pins 109 may extend through the ESC 152 so that the substrate 122 may be placed on or removed from the pedestal 150. In some embodiments, each of the lift pins 109 are not mounted to a common platform and are independently controllable. The pedestal 150 may include through holes to receive one or more of the lift pins 109. A bellows assembly 131 is coupled between the second lift 130 and bottom surface 126 to provide a flexible seal which maintains the chamber vacuum during vertical motion of the second lift 130. In some embodiments, as shown in FIG. 1, the second lift 130 is disposed outside of the hollow shaft 112.

The pedestal 150 includes gas distribution channels 138 extending, for example, from a lower surface of the pedestal 150 (e.g., bottom surface of the base assembly 136) to various openings in an upper surface of the pedestal 150. The gas distribution channels 138 are configured to provide backside gas, such as nitrogen (N) or helium (He), to the upper surface of the pedestal 150 to act as a heat transfer medium. The gas distribution channels 138 are in fluid communication with the backside gas source 141 via supply lines 142 to control the temperature and/or temperature profile of the pedestal 150 during use.

The ESC 152 includes a plurality of mesas 188 extending from a top surface of the ESC 152 configured to elevate the substrate 122 slightly above the upper surface to control heat transfer between the ESC 152 and the substrate 122 and disperse the backside gas in a more uniform manner. The plurality of mesas 188 may be any suitable shape, such as round shape, square shape, rectangular shape, triangular shape, or the like. In some embodiments, the gas distribution channels 138 are configured to provide gas pressure for heat transfer and temperature control of the edge ring 185 independently from a temperature of the ESC 152.

The process chamber 100 is coupled to and in fluid communication with a vacuum system 114 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 includes a slit valve 144 having a substrate transfer opening that is selectively opened or closed to facilitate transferring the substrate 122 into and out of the interior volume 120. In some embodiments, a transfer robot (not shown) having one or more transfer blades is configured to transfer the substrate 122.

In operation, for example, a plasma 102 may be created in the interior volume 120 to perform one or more processes. The plasma 102 may be created by coupling power from a plasma power source (e.g., RF plasma power supply 170) to a process gas via one or more electrodes near or within the interior volume 120 to ignite the process gas and creating the plasma 102. A bias power may be provided from a bias power supply (e.g., bias power supply 117) to the pedestal 150 to attract ions from the plasma 102 towards the substrate 122. The bias power supply 117 may supply bias power to the edge ring 185 and the ESC 152. For example, the bias power supply 117 may comprise a single power supply that is shared by both the edge ring 185 and the ESC 152. Backside gas, or heat transfer gas, may be provided to the substrate 122 via supply lines 142 to control the temperature and/or temperature profile of the pedestal 150 during use.

Figure 2:
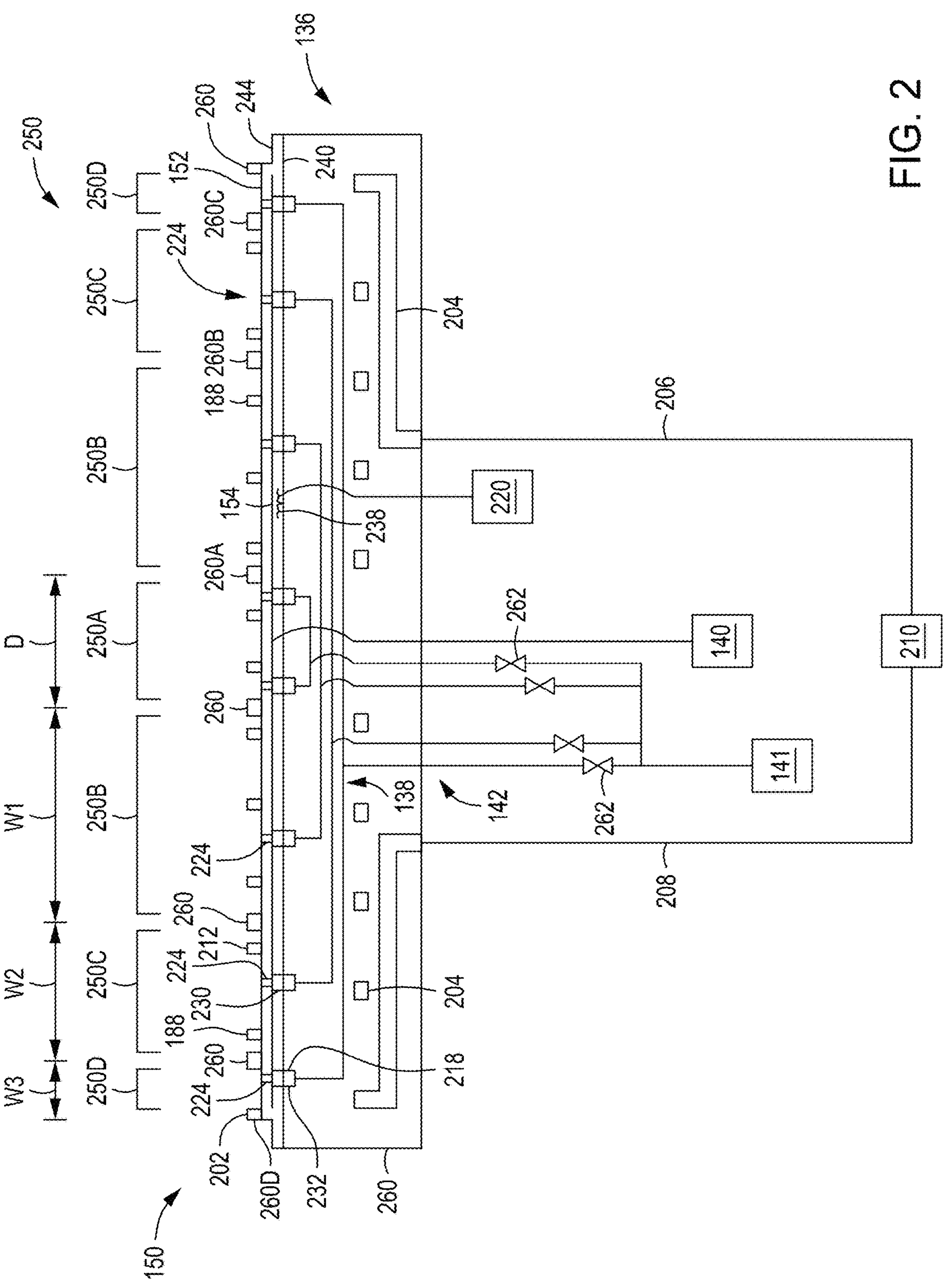
FIG. 2 depicts a schematic side view of a substrate support in accordance with at least some embodiments of the present disclosure.

FIG. 2 depicts a schematic side view of a substrate support in accordance with at least some embodiments of the present disclosure. The pedestal 150 generally comprises the base assembly 136 coupled to the ESC 152. The ESC 152 comprises a dielectric plate having the upper surface 202 and the plurality of mesas 188. In some embodiments, the base assembly 136 includes one or more cooling channels 204 disposed therein. The one or more cooling channels 204 may be coupled to a chiller 210 configured to facilitate recirculation and regulate a temperature of cooling liquid through the one or more cooling channels 204. For example, the chiller 210 may supply cooling liquid to the one or more cooling channels 204 via a first line 206. Cooling liquid from the one or more cooling channels 204 may return to the chiller 210 via a second line 208 to get chilled to a regulated temperature.

In some embodiments, the ESC 152 includes an upper peripheral notch 244 disposed about the upper surface 202, to support, for example, the edge ring 185. In some embodiments, the gas distribution channels 138 extend through the base assembly 136 and the ESC 152. The gas distribution channels 138 comprise a plurality of cooling gas outlets 224 extending through the ESC 152 that are fluidly coupled to the backside gas source 141.

In some embodiments, a porous plug 230 is disposed in each of the plurality of cooling gas outlets 224 at an interface between the ESC 152 and the base assembly 136. In some embodiments, a porous plug 232 is disposed in each gas opening 218 of the base assembly 136 opposite each of the plurality of cooling gas outlets 224. The porous plug 230 and the porous plug 232 are made of a suitable material for providing protection against plasma formation and arcing while providing an adequate flow path for backside gases.

In some embodiments, one or more heating elements 238 are disposed in the ESC 152. The one or more heating elements 238 may comprise any suitable element such as resistive heating elements. In some embodiments, the one or more heating elements 238 are disposed between the one or more chucking electrodes 154 and a lower surface 240 of the ESC 152. The one or more heating elements 238 may be arranged along one or more separate heating zones. A heater power source 220 may be coupled the one or more heating elements 238 to provide power. In some embodiments, where there is more than one heating zone, the heater power source 220 may be coupled to separate heater terminals coupled to the lower surface 240.

The gas distribution channels 138 extend to the plurality of cooling gas outlets 224, which are arranged to define a plurality of backside gas cooling zones 250 disposed in the ESC 152. The plurality of backside gas cooling zones 250 may be arranged radially, or concentrically, along the upper surface 202. For example, the plurality of backside gas cooling zones 250 may consist of four backside gas cooling zones 250A-D, with an innermost cooling zone 240A disposed at a central region and a second innermost cooling zone 240B disposed adjacent the innermost cooling zone 240A. An outermost cooling zone 240D is disposed at an edge region of the ESC 152 and a second outermost zone 240C is disposed between the outermost cooling zone 240D and the second innermost cooling zone 240B.

The gas distribution channels 138 comprise four gas channels disposed in the ESC 152 that correspond to the four backside gas cooling zones 250A-D. The four gas channels are fluidly independent within the ESC 152 and each of the four gas channels extend from the lower surface 240 of the ESC 152 to respective ones of a plurality of cooling gas outlets 224 extending to the upper surface 202 within each corresponding cooling zone. In some embodiments, a control valve 262 is disposed in line with each of the supply lines 142 to control a flow rate of the cooling gas to each of the four backside gas cooling zones 250A-D.

In some embodiments, a plurality of seal rings 260 extend from the upper surface 202 of the ESC 152 to the first height to define the four backside gas cooling zones 250A-D therebetween. In some embodiments, the first height is about 5 to about 100 micrometers. The innermost cooling zone 250A has a diameter D that is less than a width W1 of a second innermost cooling zone 250B, the width W1 defined between an inner diameter and an outer diameter of the second innermost cooling zone 250B. Similarly, the second outermost cooling zone 250C has a width W2 and the outermost cooling zone 250D has a width W3. In some embodiments, the width W3 is less than the diameter D, less than the width W2, and less than the width W1. In other words, the outermost cooling zone 250D is narrower than the inner three cooling zones 250A-250C. In some embodiments, the width W2 is less than the width W1. In some embodiments, the width W3 is about 2 to about 8 mm. In some embodiments, the width W2 is about 20 to about 40 mm. In some embodiments, the width W2 is about 70 to about 100 mm. In some embodiments, the diameter D is about 10 to about 30 mm.

In some embodiments, a width of each of the plurality of seal rings 260 is about 0.5 to about 3 mm. In some embodiments, a width of a fourth 260D of the seal rings is greater than a width of a first seal ring 260A, a second seal ring 260B, and a third seal ring 260C of the plurality of seal rings 260. The fourth 260D of the seal rings is a radially outermost seal ring of the plurality of seal rings 260. In some embodiments, the first seal ring 260A is disposed about 15 to about 25 mm from a center of the ESC 152. In some embodiments, the second seal ring 260B is disposed about 100 to about 130 mm from the center of the ESC 152. In some embodiments, the third seal ring is disposed about 135 to about 142 mm from the center of the ESC 152. In some embodiments, the fourth seal ring is disposed about 142 to about 148 mm from the center of the ESC 152.

Figure 3:
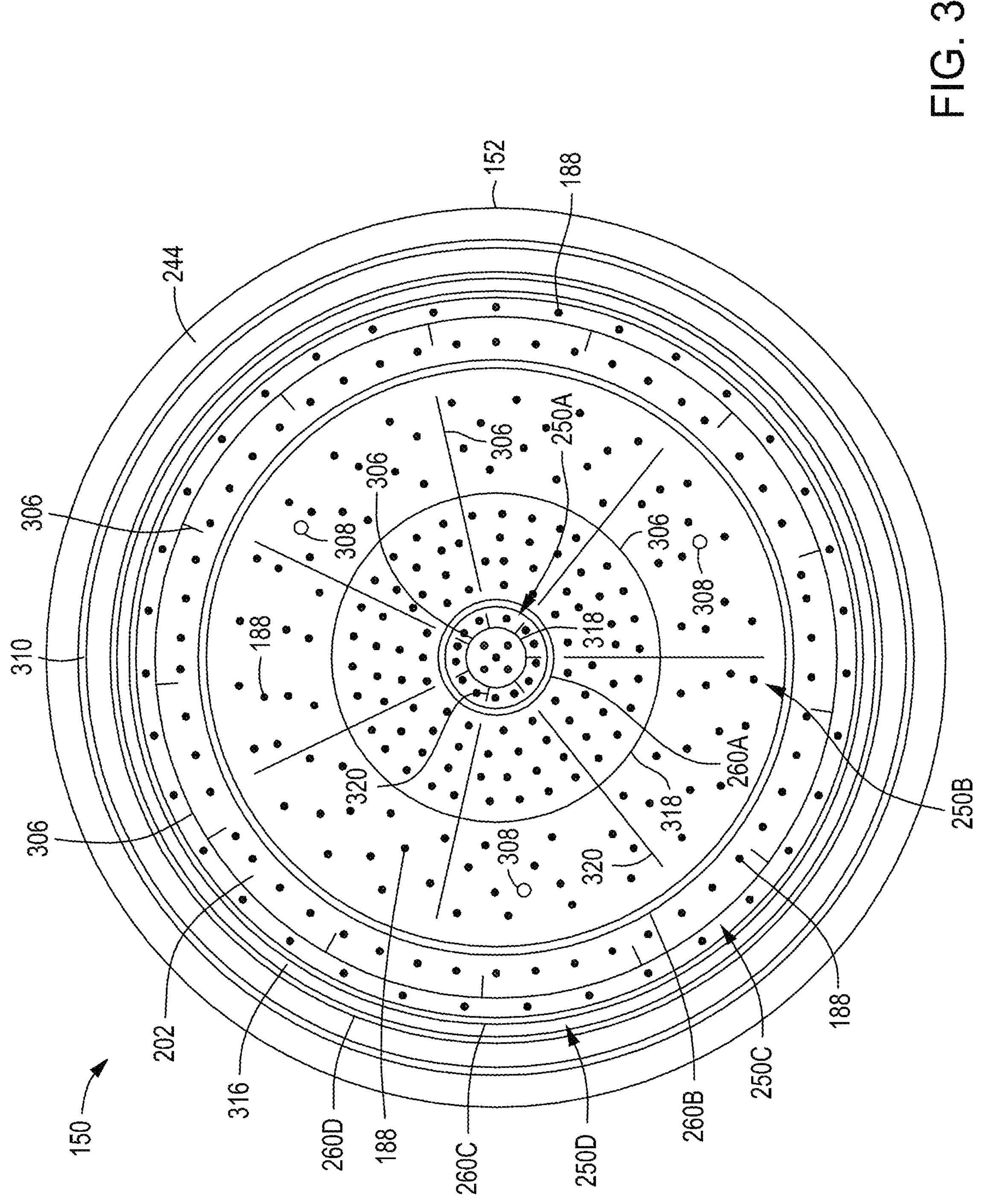
FIG. 3 depicts a top view of an electrostatic chuck in accordance with at least some embodiments of the present disclosure.
Figure 4:
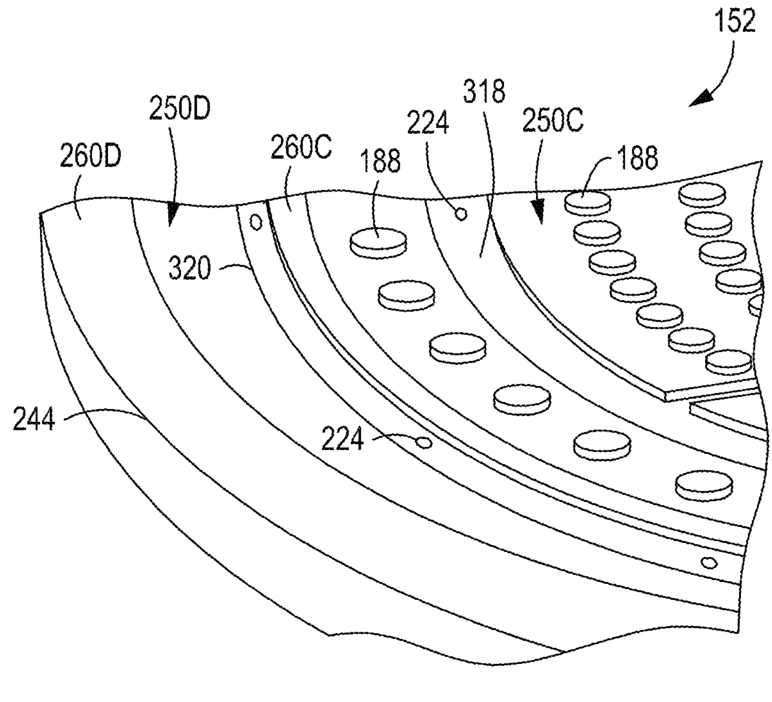
FIG. 4 depicts a top isometric view of a portion of an electrostatic chuck in accordance with at least some embodiments of the present disclosure.

FIG. 3 depicts a top view of an electrostatic chuck in accordance with at least some embodiments of the present disclosure. FIG. 4 depicts a top isometric view of a portion of an electrostatic chuck (ESC) 152 in accordance with at least some embodiments of the present disclosure. In some embodiments, the upper surface 202 of the ESC 152 includes one or more gas grooves 306 for each of the four backside gas cooling zones 250A-250D and the plurality of cooling gas outlets 224 are disposed in corresponding ones of the one or more gas grooves 306. In some embodiments, the plurality of cooling gas outlets 224 consist of about 10 to about 20 outlets for each cooling zone. In some embodiments, the ESC 152 includes a plurality of lift pin openings 308. In some embodiments, the plurality of lift pin openings 308 are disposed between the first seal ring 260A and the second seal ring 260B of the plurality of seal rings 260.

The one or more gas grooves 306 may be arranged in any suitable pattern. For example, the one or more gas grooves 306 may be arranged in annular patterns, radial patterns, or a combination of annular and radial patterns for each of the plurality of backside gas cooling zones. In some embodiments, the one or more gas grooves 306 associated with the outermost cooling zone 250D of the plurality of backside gas cooling zones 250 consists of an annular groove 316. In some embodiments, outermost cooling zone 250D has no radial grooves extending from the annular groove 316. In some embodiments, the one or more gas grooves 306 associated with the innermost cooling zone 250A and second innermost cooling zone 250B include annular gas grooves 318 and radial gas grooves 320 extending from respective annular gas groove 318. In some embodiments, the radial gas grooves 320 associated with the second innermost cooling zone 250B extend radially inward and radially outward of the annular gas groove 318.

While the foregoing is directed to embodiments of the present disclosure, other and further embodiments of the disclosure may be devised without departing from the basic scope thereof.

The invention claimed is:

1. An electrostatic chuck for holding a substrate, comprising:

a dielectric plate having an upper surface and a plurality of raised mesas extending from the upper surface to a first height to at least partially define a support surface for the substrate;

four backside gas cooling zones disposed in the dielectric plate;

four gas channels disposed in the dielectric plate and each of the four gas channels corresponding to one of the four backside gas cooling zones, wherein the four gas channels are fluidly independent within the dielectric plate such that gas flow within one of the four gas channels and corresponding backside gas cooling zone does not fluidly communicate within the dielectric plate with gas flow within another of the four gas channels and corresponding backside gas cooling zone and extend from a lower surface of the dielectric plate to a plurality of cooling gas outlets extending to the upper surface within each corresponding cooling zone;

wherein the upper surface of the dielectric plate includes one or more gas grooves for each of the four backside gas cooling zones, and wherein the plurality of cooling gas outlets are disposed in corresponding ones of the one or more gas grooves the one or more gas grooves associated with an outermost cooling zone of the four backside gas cooling zones consists of a single annular groove a plurality of seal rings extending from the upper surface of the dielectric plate to the first height and defining the four backside gas cooling zones; and one or more electrodes disposed in the dielectric plate and configured to chuck the substrate when disposed on the support surface.

2. The electrostatic chuck of claim 1, wherein the four backside gas cooling zones are concentrically arranged along the upper surface.

3. The electrostatic chuck of claim 2, wherein an outermost cooling zone of the four backside gas cooling zones is narrower than an inner three cooling zones of the four backside gas cooling zones.

4. The electrostatic chuck of claim 3, wherein the outermost cooling zone has a width defined from an inner diameter to an outer diameter of the outermost cooling zone of about 2 to about 8 mm.

5. The electrostatic chuck of claim 2, wherein an innermost cooling zone of the four backside gas cooling zones has a diameter that is less than a width of a second innermost cooling zone of the four backside gas cooling zones, the width defined between an inner diameter and an outer diameter of the second innermost cooling zone.

6. The electrostatic chuck of claim 1, wherein a width of each of the plurality of seal rings is about 0.5 to about 3 mm.

7. The electrostatic chuck of claim 1, wherein the plurality of cooling gas outlets consist of about 10 to about 20 outlets for each cooling zone.

8. An electrostatic chuck for holding a substrate, comprising:

a dielectric plate having an upper surface and a plurality of raised mesas extending from the upper surface to a first height to at least partially define a support surface for the substrate;

four backside gas cooling zones disposed in the dielectric plate;

four gas channels disposed in the dielectric plate and each of the four gas channels corresponding to one of the four backside gas cooling zones, wherein the four gas channels are fluidly independent within the dielectric plate such that gas flow within one of the four gas channels and its corresponding backside gas cooling zone does not fluidly communicate within the dielectric plate with gas flow within another of the four gas channels and its corresponding backside gas cooling zone, and extend from a lower surface of the dielectric plate to a plurality of cooling gas outlets extending to the upper surface within each corresponding cooling zone;

wherein the upper surface includes one or more gas grooves for each of the four backside gas cooling zones, and wherein the plurality of cooling gas outlets are disposed in corresponding ones of the one or more gas grooves, wherein the one or more gas grooves associated with two innermost ones of the four backside gas cooling zones include an annular gas groove and radial gas grooves extending from the annular gas groove a plurality of seal rings extending from the upper surface of the dielectric plate to the first height and defining the four backside gas cooling zones, wherein a first of the seal rings is disposed about 15 to 25 mm from a center of the dielectric plate, a second of the seal rings is disposed about 100 to about 130 mm from the center, a third of the seal rings is disposed about 135 to about 142 mm from the center, and a fourth of the seal rings is disposed about 142 to about 148 mm from the center; and one or more electrodes disposed in the dielectric plate and configured to chuck the substrate when disposed on the support surface.

9. The electrostatic chuck of claim 8, wherein a width of the fourth of the seal rings is greater than a width of the first, the second, and the third of the seal rings.

10. The electrostatic chuck of claim 8, wherein the dielectric plate includes a plurality of lift pin openings disposed between the first and the second of the seal rings.

11. The electrostatic chuck of claim 8, wherein the plurality of raised mesas have a round shape.

12. A process chamber for processing a substrate, comprising:

a chamber body defining an interior volume therein;

an electrostatic chuck disposed in the interior volume, the electrostatic chuck comprising:

a dielectric plate having an upper surface and a plurality of raised mesas extending from the upper surface to a first height to at least partially define a support surface for the substrate;

four backside gas cooling zones disposed in the dielectric plate;

four gas channels disposed in the dielectric plate and each of the four gas channels corresponding to one of the four backside gas cooling zones, wherein the four gas channels are fluidly independent within the dielectric plate;

wherein the upper surface includes one or more gas grooves for each of the four backside gas cooling zones, and wherein the plurality of cooling gas outlets are disposed in corresponding ones of the one or more gas grooves, wherein the one or more gas grooves associated with two innermost ones of the four backside gas cooling zones include an annular gas groove and radial gas grooves extending from the annular gas groove and extend from a lower surface of the dielectric plate to a plurality of cooling gas outlets extending to the upper surface within each corresponding cooling zone; and a plurality of seal rings extending from the upper surface of the dielectric plate to the first height and defining the four backside gas cooling zones; and one or more electrodes disposed in the dielectric plate and configured to chuck the substrate when disposed on the support surface.

13. The process chamber of claim 12, further comprising supply lines that extend to corresponding ones of the gas channels, and a control valve disposed in line with each of the supply lines configured to control a flow rate of a cooling gas to each of the four backside gas cooling zones.

14. The process chamber of claim 12, wherein the process chamber is an etch chamber.

15. The process chamber of claim 12, wherein the backside gas cooling zones are concentrically arranged along the upper surface, and wherein:

an innermost cooling zone of the four backside gas cooling zones has a diameter that is less than a radial width of a second innermost cooling zone of the four backside gas cooling zones, the radial width defined between an inner diameter and an outer diameter of the second innermost cooling zone, and an outermost cooling zone of the four backside gas cooling zones has a radial width defined between an inner diameter and an outer diameter of the outermost cooling zone that is less than the diameter of the innermost cooling zone and less than the radial width of the second innermost cooling zone.

16. The process chamber of claim 12, wherein a radial width between an inner diameter and an outer diameter of an outermost one of the plurality of seal rings is greater than a radial width between an inner diameter and an outer diameter, respectively, of all innermost ones of the plurality of seal rings.

* * * * *